United States Patent
Sakai et al.

(10) Patent No.: US 12,356,598 B2
(45) Date of Patent: Jul. 8, 2025

(54) NOISE SUPPRESSION TAPE

(71) Applicant: Mitsubishi Electric Corporation, Tokyo (JP)

(72) Inventors: Ayumi Sakai, Tokyo (JP); Yosuke Watanabe, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 221 days.

(21) Appl. No.: 17/994,462

(22) Filed: Nov. 28, 2022

(65) Prior Publication Data

US 2023/0092020 A1 Mar. 23, 2023

Related U.S. Application Data

(63) Continuation of application No. PCT/JP2020/027596, filed on Jul. 16, 2020.

(51) Int. Cl.
*H05K 9/00* (2006.01)
(52) U.S. Cl.
CPC .................. *H05K 9/0098* (2013.01)
(58) Field of Classification Search
CPC ............................. H05K 9/00; H05K 9/0098
USPC ........................................................ 174/36
See application file for complete search history.

(56) References Cited

U.S. PATENT DOCUMENTS

2022/0361384 A1  11/2022  Tian

FOREIGN PATENT DOCUMENTS

| CN | 111163623 A | 5/2020 |
|---|---|---|
| JP | 58-6313 U | 1/1983 |
| JP | 63-94700 A | 4/1988 |
| JP | 5-34161 U | 5/1993 |
| JP | 5-283883 | 10/1993 |
| JP | 2004-139796 A | 5/2004 |

OTHER PUBLICATIONS

German Office Action for German Application No. 11 2020 007 167.7, dated Oct. 13, 2023, with English translation.
International Search Report for PCT/JP2020/027596(PCT/ISA/210) mailed on Oct. 13, 2020.
Written Opinion of the International Searching Authority for PCT/JP2020/027596(PCT/ISA/237) mailed on Oct. 13, 2020.
Chinese Office Action and Search Report for Chinese Application No. 202080102928.4, dated Feb. 24, 2025, with English translation.

*Primary Examiner* — Tremesha W Burns
(74) *Attorney, Agent, or Firm* — Birch, Stewart, Kolasch & Birch, LLP (57) ABSTRACT

A noise suppression tape is provided with a tape-shaped insulator, a sticky layer, and a conductive layer.

In the sticky layer, one surface is exposed and the other surface is joined to be fixed to one surface of the insulator. A width of the sticky layer is the same as a width of the insulator. The conductive layer, one surface of which is exposed and flush with the one surface of the sticky layer, is embedded in the sticky layer to be fixed to the sticky layer. A width of the conductive layer is smaller than the width of the sticky layer.

3 Claims, 5 Drawing Sheets

NOISE SUPPRESSION TAPE

CROSS REFERENCE TO RELATED APPLICATIONS

This application is a Continuation of PCT International Application No. PCT/JP2020/027596, filed on Jul. 16, 2020, all of which is hereby expressly incorporated by reference into the present application.

TECHNICAL FIELD

The present disclosure relates to a noise suppression tape, and especially relates to a noise suppression tape suitable for use in a shield cable.

BACKGROUND ART

As a communication cable that transmits a high-frequency signal to a communication device, a shield cable is generally used to protect the communication cable from surrounding noise in a high noise environment or to suppress an influence of noise coming out from the communication cable connected to a high-power communication device.

There is a method of using a shield connector for connection between the communication device and the shield cable.

In the method of using the shield connector, the entire periphery of a shield conductor in the shield cable is electrically connected to the shield connector, and the shield conductor is connected to a ground potential, thereby blocking noise from the outside to an inner conductor that is a core wire in the shield cable or blocking noise from the inner conductor in the shield cable to the outside.

However, there is a case where the shield connector cannot be used due to design restrictions and the like, and in this case, a method of connecting the shield cable to the communication device with a structure referred to as a pigtail is adopted.

For example, in an industrial device and the like to which a large number or signal lines are often connected, various signals ranging from an analog signal to a high-speed digital signal are transmitted to/from a plurality of devices having different functions by a communication cable, so that the signal lines are gathered and use one connector in some cases.

In a case where a size of the connector is determined in advance and it is necessary to connect a thin communication cable to the connector, even if the inner conductor of the communication cable can be connected to a connector pin, there is a case where connection between the communication device and the shield conductor in the shield cable cannot be achieved.

In such a case, in a case where the shield cable and the communication device are connected to each other by using a structure referred to as a pigtail, it is necessary to increase a length of the pigtail in a distal end of the shield cable, that is, in a pigtail arrangement portion for electrical connection with the communication device due to design and workability restrictions in attachment work of the pigtail when achieving electrical connection. As a result, an exposed portion of an inner covering body interposed between the inner conductor and the shield conductor tends to be inevitably long.

When the exposed portion of the inner covering body is inevitably long, around the exposed portion of the inner covering body there is no shield structure implemented by the shield conductor for the inner conductor, the noise which has been propagated to the shield conductor propagates to the pigtail, and the noise is radiated from the pigtail and interferes with the high-frequency signal transmitted through the inner conductor. As a result, a situation in which shielding performance is deteriorated easily occurs.

Since around the exposed portion of the inner covering body there is no shield conductor surrounding the inner conductor, noise of an external device and the like easily interferes with the inner conductor, so that a situation in which nose immunity is deteriorated easily occurs.

Incidentally, Patent Literature 1 discloses an electromagnetic shielding material surrounding a periphery of a bundle body obtained by bundling cables not a shield cable but an interface cable, a power cable and the like, or cords emitting unnecessary radiation such as electric wires.

The electromagnetic shielding material disclosed in Patent Literature 1 is obtained by providing an insulating film on each of from, and back surfaces of a conductive and elongated thin body.

CITATION LIST

Patent Literatures

Patent Literature 1: JP 5-283883 A

SUMMARY OF INVENTION

Technical Problem

It is conceivable that the electromagnetic shielding material disclosed in Patent Literature 1 is wound around the exposed portion of the inner covering body in the shield cable to block noise from the outside to the inner conductor or block noise from the inner conductor to the outside in the exposed portion.

However, in an overlapping portion of the wound electromagnetic shielding material, capacitance coupling occurs between the conductive thin body on an upper layer and the conductive thin body on a lower layer via the insulating films. Resonance occurs due to the capacitance and self-inductance of the conductive thin body in the electromagnetic shielding material, and thereby there is a possibility that a transmission characteristic of a high-frequency signal transmitted through the inner conductor of the shield cable is deteriorated at a specific frequency.

The present disclosure has been made in view of the above-described problems, and an object thereof is to obtain a noise suppression tape which, when used in the exposed portion of the inner covering body at the distal end of the shield cable, is capable of blocking noise from the outside to the inner conductor in the shield cable, or suppressing deterioration in shielding performance against noise from the inner conductor in the shield cable to the outside and noise immunity in the exposed portion of the inner covering body, and capable of suppressing deterioration in a transmission characteristic of a high-frequency signal transmitted through the inner conductor in the shield cable, without impairing workability of the shield cable at the time of connecting to a device.

Solution to Problem

A noise suppression tape according to the present disclosure includes: a tape-shaped base including an elongated insulator including a first surface, a second surface, a first side face, and a second side face, and a conductor including a first surface, a second surface, a first side face, and a second side face, the conductor having a same length as the insulator, the conductor being disposed in parallel with the insulator, the first side face of the conductor being joined to be fixed to the second side face of the insulator; and an adhesive layer having a same length as the base, the adhesive layer including a sticky layer including a first surface, a second surface, a first side face, and a second side face, and a conductive adhesive layer including a first surface, a second surface, a first side face, and a second side face, the conductive adhesive layer being disposed in parallel with the sticky layer, the first side face of the conductive adhesive layer being joined so the second side face of the sticky layer, the first side face of the sticky layer being flush with the first side face of the insulator, the second side face of the conductive adhesive layer being flush with the second side face of the conductor, a first surface of the adhesive layer being joined to be fixed to a first surface of the base.

Advantageous Effects of Invention

When used in an exposed portion of an inner covering body at a distal end of a shield cable, the present disclosure has an effect of suppressing deterioration in shielding performance and noise immunity in the exposed portion of the inner covering body, and of suppressing deterioration in a transmission characteristic of a high-frequency signal transmitted through an inner conductor in the shield cable, without impairing workability of the shield cable at the time of connecting to a device.

DESCRIPTION OF EMBODIMENTS

First Embodiment

Figure 1:
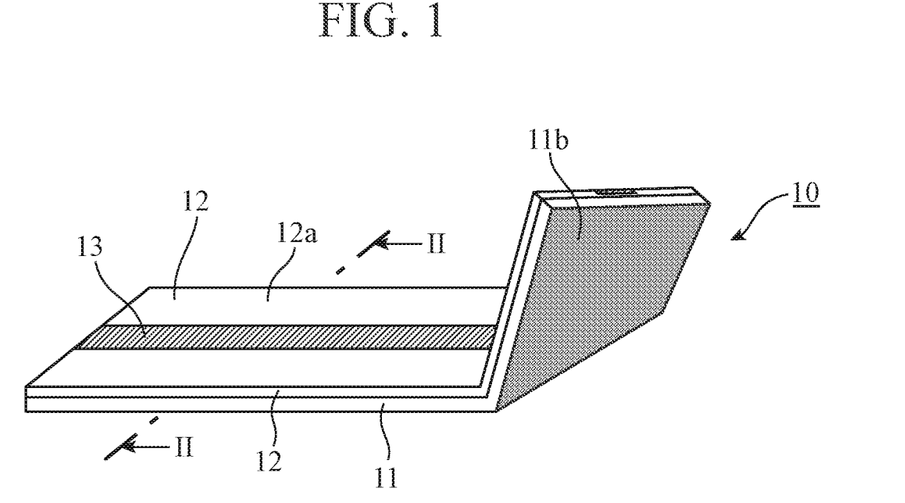
FIG. 1 is a perspective view of a noise suppression tape according to a first embodiment.
Figure 2:
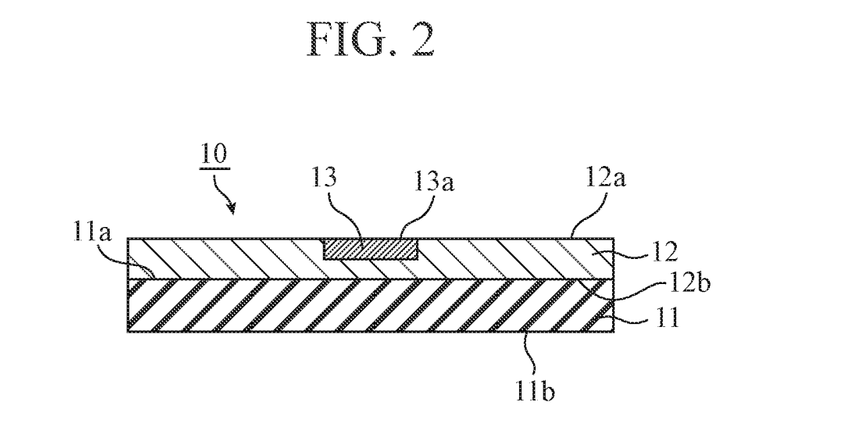
FIG. 2 is a cross-sectional view taken along line II-II in FIG. 1.

A noise suppression tape 10 according to a first embodiment is described with reference to FIGS. 1 and 2.

The noise suppression tape 10 is provided with an insulator 11, a sticky layer 12, and a conductive layer 13. The noise suppression tape 10 has a structure in which the sticky layer 12 and the conductive layer 13 are stacked on one surface 11a of the insulator 11 having a tape shape.

In the sticky layer 12, one surface 12a is exposed and the other surface 12b is joined to be fixed to the one surface 11a of the insulator 11. A width of the sticky layer 12 is the same as a width of the insulator 11. In the first embodiment, the width refers to a short-side direction of the noise suppression tape 10, and a longitudinal direction refers to a long-side direction of the noise suppression tape 10.

The sticky layer 12 an adhesive such as an epoxy resin adhesive, a hot melt adhesive, a rubber solvent type adhesive, an elastic adhesive, or a phenol resin adhesive.

The conductive layer 13, one surface 13a of which is exposed and flush with the one surface 12a of the sticky layer 12, is embedded in the sticky layer 12 to be fixed to the sticky layer 12. A width of the conductive layer 13 is smaller than the width of the sticky layer 12. The conductive layer 13 is disposed in the longitudinal direction and at the center in a width direction of the sticky layer 12.

The conductive layer 13 is a flexible and strip-shaped conductor made of conductive metal foil such as copper foil or aluminum foil, a conductive adhesive obtained by mixing conductive metal, carbon fiber, or powder with an adhesive such as an epoxy resin adhesive, a hot melt adhesive, a rubber solvent type adhesive, an elastic adhesive, or a phenol resin adhesive, or a flexible and strip-shaped conductive tape obtained by impregnating a porous non-conductive tape of nonwoven fabric with a conductive adhesive.

Next, Application Example 1 in a case where the noise suppression tape 10 according to the first embodiment is used in a shield cable 1 is described with reference to FIG. 3.

In the shield cable 1, an inner conductor 2, an inner covering body 3, a shield conductor 4, and an outer covering body 5 are concentrically formed from inside outward.

The inner conductor 2 is a core wire through which a high-frequency signal from a communication device 50 or a high-frequency signal to the communication device 50 is transmitted. The inner conductor 2 is a copper wire or a stranded wire of a copper wire. Although one signal line is illustrated as the inner conductor 2 in the first embodiment, this may also be a plurality of signal lines.

The inner covering body 3 is an insulator made of a synthetic resin that covers the entire outer peripheral surface of the inner conductor 2.

The shield conductor 4 covers the entire outer peripheral surface of the inner covering body 3. The shield conductor 4 includes a resin layer 4a in contact with the inner covering body 3 and a shielding outer conductor 4b located on an outer periphery of the resin layer 4a.

The shielding outer conductor 4b is a braided wire made of conductive metal, and includes conductive foil such as copper foil.

The outer covering body 5 is an insulator made of a synthetic resin that covers the entire outer peripheral surface of the shield conductor 4.

At a distal end of the shield cable 1, that is, at an end where electrical connection with the communication device 50 is performed, the inner conductor 2 protrudes from the inner covering body 3, the outer peripheral surface of the inner covering body 3 is exposed, and the outer peripheral surface of the shielding outer conductor 4b of the shield conductor 4 is exposed. The shielding outer conductor 4b located in a portion where the inner covering body 3 is exposed is connected to a pigtail 4c. A distal end of the pigtail 4c is electrically connected to a housing 51 serving as a ground potential node in the communication device 50, that is, a ground. Note that, instead of the pigtail 4c, the shielding outer conductor 4b and the housing 51 may be electrically connected by wire.

In the communication device 50, inside the housing 51, a substrate 52 on which an electric circuit component necessary for the communication device is mounted is disposed, and a connector 53 for electrical connection with the electric circuit component is disposed on the substrate 52. The housing 51 is provided with a through hole 51a through which the inner conductor 2 and the inner covering body 3 of the shield cable 1 pass.

A distal end portion of the inner conductor 2 in the shield cable 1 is inserted into a pin portion of the connector 53 and thereby electrically connected thereto.

Figure 3:
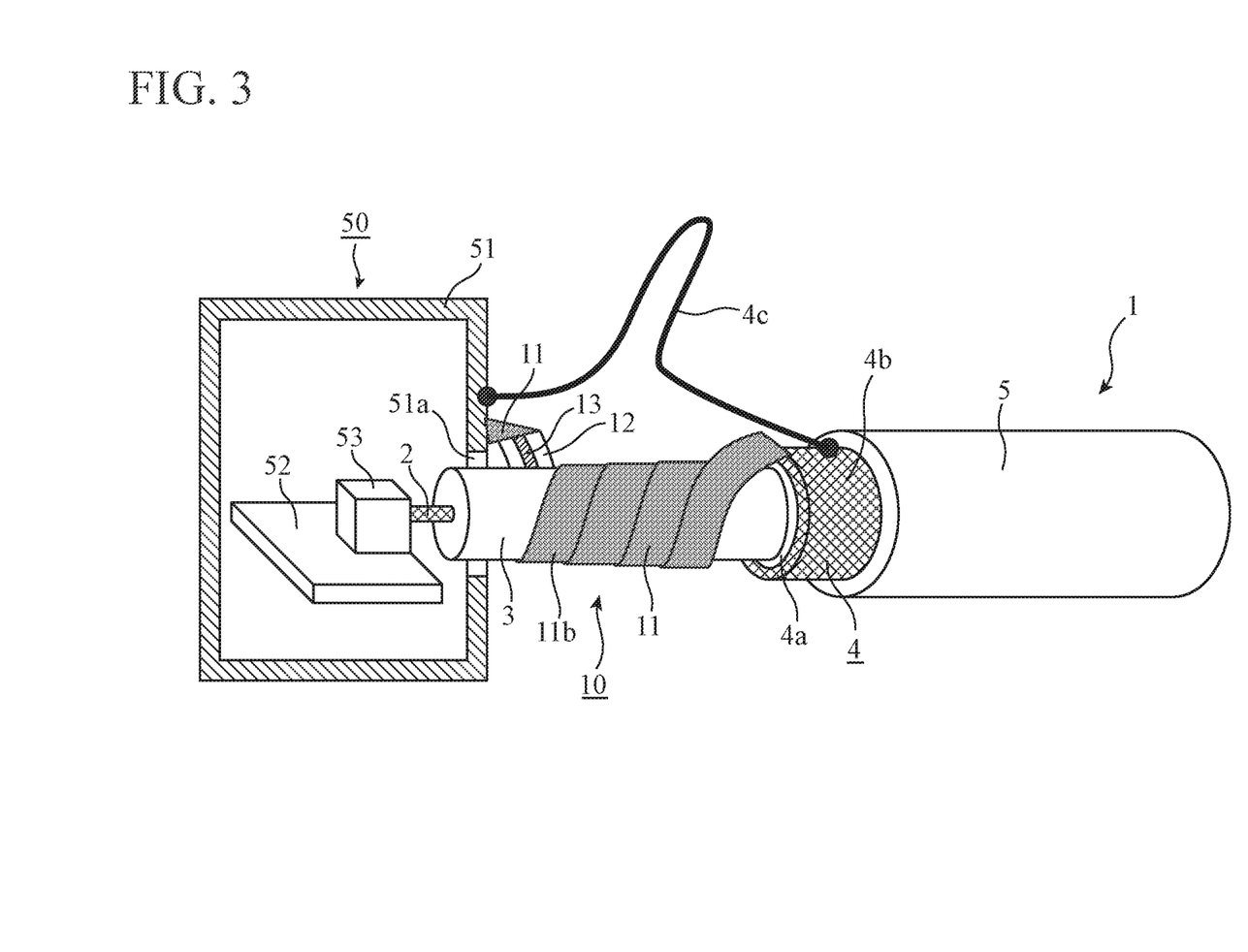
FIG. 3 is a configuration diagram illustrating Application Example 1 in a case where the noise suppression tape according to the embodiment is used in a shield cable.

Incidentally, a relationship between the noise suppression tape 10 and the shield cable 1 is as illustrated in FIG. 3.

That is, the middle portion of the noise suppression tape 10 as spirally wound around the exposed outer peripheral surface of the inner covering body 3 at the distal end of the shield cable 1 with side portions of the noise suppression tape 10 overlapping each other in such a manner that the other surface 11b of the insulator 11 serving as an outer surface is on an outer side. In addition, the one surface 12a of the sticky layer 12 and the one surface 13a of the conductive layer 13 are adhered to the exposed outer peripheral surface of the inner covering body 3.

At one end of the noise suppression tape 10, one end of the conductive layer 13 is electrically connected to a surface of the shielding outer conductor 4b of the shield conductor 4 of the shield cable 1.

At the other end of the noise suppression tape 10, the other end of the conductive layer 13 is electrically connected to the housing 51.

As a result, the entire area of the conductive layer 13 of the noise suppression tape 10 serves as the ground potential node, that is, the ground.

Therefore, the conductive layer 13 of the noise suppression tape 10 forms a shield structure for the inner conductor 2 located inside the exposed inner covering body 3 at the distal end of the shield cable 1, and thereby exhibits an effect of blocking noise, so that deterioration in shielding performance and noise Immunity can be suppressed.

When the noise suppression tape 10 is spirally wound around the exposed outer peripheral surface of the inner covering body 3, the outer surface of the noise suppression tape 10 is the other surface 11b of the insulator 11, so that even if another conductor comes into contact with the noise suppression tape 10, an electrical short circuit does not occur. Furthermore, since the insulator 11 forms the outer surface of the noise suppression tape 10, corrosion of the outer surface of the noise suppression tape 10 is prevented.

Therefore, an additional work such as winding an insulator tape for an insulation property and a corrosion resistance property of the noise suppression tape 10 against the outside is not required. Therefore, an increase in the number of manufacturing steps, cost, system weight and the like is suppressed.

Furthermore, in the noise suppression tape 10, the one surface 13a of the conductive layer 13 is exposed, so that electrical connection between the one end of the conductive layer 13 and the shielding outer conductor 4b of the shield cable 1, and electrical connection between the other end of the conductive layer 13 and the housing 51 of the communication device 50 are facilitated.

When the noise suppression tape 10 is spirally wound around the exposed outer peripheral surface of the inner covering body 3, the side portion of the noise suppression tape 10 located on an upper layer and the side portion of the noise suppression tape 10 located on a lower layer overlap each other. However, the conductive layer 13 located on the upper layer and the conductive layer 13 located on the lower layer do not overlap each other or the overlap can be made as small as possible, since the width of the conductive layer 13 is smaller than the width of the sticky layer 12. Therefore, an influence of capacitance coupling between the conductive layer 13 located on the upper layer and the conductive layer 13 located on the lower layer in the overlapped portion can be made as small as possible. Therefore, the noise suppression tape 10 can shift a specific frequency that deteriorates a transmission characteristic of the high-frequency signal transmitted through the inner conductor 2 of the shield cable 1 to a higher frequency to suppress an influence on the signal transmission.

Next, Application Example 2 in a case where the noise suppression tape 10 according to the first embodiment is used in the shield cable 1 is described with reference to FIG. 4.

In Application Example 1, the middle portion of the noise suppression tape 10 is spirally wound around the exposed outer peripheral surface of the inner covering body 3, whereas in Application Example 2, this is adhered in the longitudinal direction.

That is, the middle portion of the noise suppression tape 10 is laid in the longitudinal direction of the shield cable 1 on the exposed outer peripheral surface of the inner covering body 3 at the distal end of the shield cable 1 in such a manner that the other surface 11b of the insulator 11 serving as the outer surface is on the outer side. In addition, the one surface 12a of the sticky layer 12 and the one surface 13a of the conductive layer 13 are adhered to the exposed outer peripheral surface of the inner covering body 3.

At one end of the noise suppression tape 10, one end of the conductive layer 13 is electrically connected to a surface of the shielding outer conductor 4b of the shield conductor 4 of the shield cable 1.

At the other end of the noise suppression tape 10, the other end of the conductive layer 13 is electrically connected to the housing 51.

As a result, the entire area of the conductive layer 13 of the noise suppression tape 10 serves as the ground potential node, that is, the ground.

In Application Example 2 configured in this manner, as in Application Example 1, the effect of shielding the inner conductor 2 of the shield cable 1 from noise is exhibited in the portion where the inner covering body 3 of the shield cable 1 is exposed. In addition, it is not necessary to newly consider the insulation property and a corrosion resistance property of the noise suppression tape 10 against the outside while suppressing the increase in the number of manufacturing steps, cost, system weight and the like. In addition, the electrical connection between the one end of the conductive layer 13 and the shielding outer conductor 4b of the shield cable 1, and the electrical connection between the other end of the conductive layer 13 and the housing 51 of the communication device 50 are facilitated.

In Application Examples 1 and 2, the application example of the noise suppression tape 10 in a case where one connector 53 is connected to one shield cable 1 has been described, but the noise suppression tape 10 may be applied to each of a plurality of shield cables 1 connected to the connector 53.

In this case, the noise suppression tapes 10 are adhered to the respective shield cables 1 as described in Application Example 1 or 2.

In Application Examples 1 and 2, the application example of the noise suppression tape 10 in a case where the shield cable 1 is connected to the connector 53 disposed inside the housing 51 of the communication device 50 has been described, but the noise suppression tape 10 may be similarly applied to the shield cable 1 also in a case where the shield cable 1 is connected to a relay connector instead of the connector 53.

Furthermore, the noise suppression tape 10 according to the first embodiment may be applied in a case where by winding a noise suppression tape from a connection-start end to a connection-destination end of a dedicated communication cable not including the shield conductor 4, a shield structure is obtained over the entire area of the dedicated communication cable.

Second Embodiment

A noise suppression tape 10 according to a second embodiment is described with reference to FIG. 5.

The noise suppression tape 10 according to the second embodiment is the same as the noise suppression tape 10 according to the first embodiment except that, in a conductive layer 13, widths of electrical connection portions 13b and 13c located at both ends in a longitudinal direction of the noise suppression tape 10 are larger than a width of a middle portion 13d.

Figure 4:
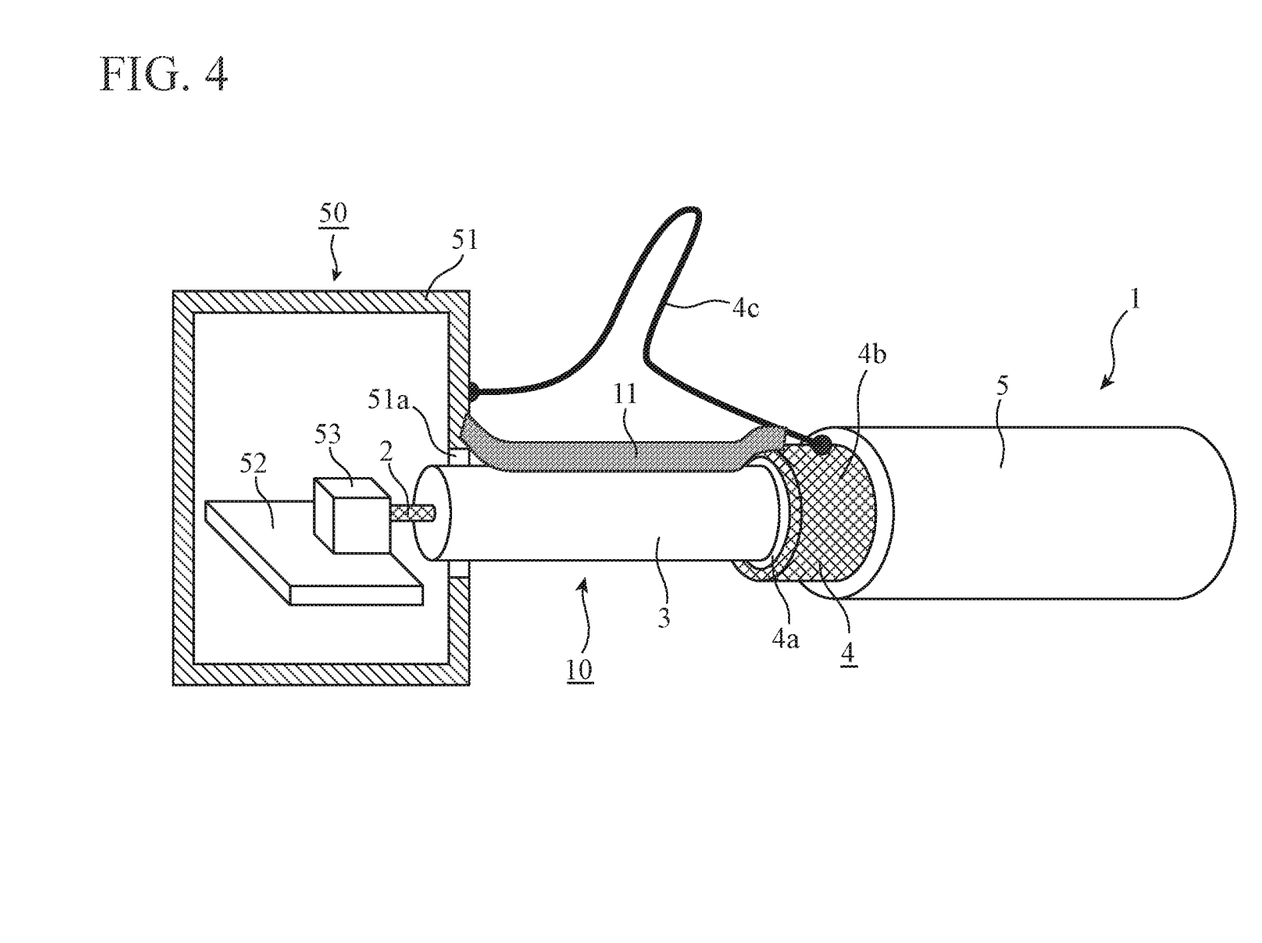
FIG. 4 is a configuration diagram illustrating Application Example 2 in a case where the noise suppression tape according to the embodiment is used in a shield cable.
Figure 5:
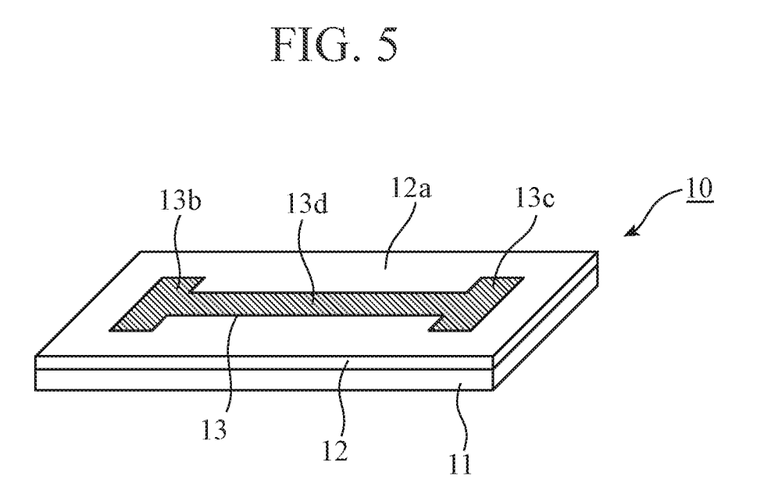
FIG. 5 is a perspective view of a noise suppression tape according to a second embodiment.

Note that, in FIG. 5, the same reference sign as that in FIGS. 1 to 4 represents the same or corresponding portion.

Like the noise suppression tape 10 according to the first embodiment, the noise suppression tape 10 according to the second embodiment is applied as in Application Example 1 illustrated in FIG. 3 and Application Example 2 illustrated in FIG. 4.

That is, in Application Example 1, the middle portion of the noise suppression tape 10 is spirally wound around an exposed outer peripheral surface of an inner covering body 3 at a distal end of a shield cable 1 with side portions in the middle portion of the noise suppression tape 10 overlapping each other in such a manner that the other surface lib of an insulator 11 serving as an outer surface is on an outer side. In addition, one surface 12a of a sticky layer 12 and one surface 13a of the conductive layer 13 are adhered to the exposed outer peripheral surface of the inner covering body 3.

At one end of the noise suppression tape 10, the electrical connection portion 13b of the conductive layer 13 is electrically connected to a surface of a shielding outer conductor 4b of a shield conductor 4 of the shield cable 1.

At the other end of the noise suppression tape 10, the electrical connection portion 13c of the conductive layer 13 is electrically connected to a housing 51.

As a result, the entire area of the conductive layer 13 of the noise suppression tape 10 serves as a ground potential node, that is, a ground.

In Application Example 2, the middle portion of the noise suppression tape 10 is laid in a longitudinal direction of the shield cable 1 on the exposed outer peripheral surface of the inner covering body 3 at the distal end of the shield cable 1 in such a manner that the other surface 11b of the insulator 11 serving as the outer surface is on the outer side. In addition, the one surface 12a of the sticky layer 12 and the one surface 13a of the conductive layer 13 are adhered to the exposed outer peripheral surface of the inner covering body 3.

At the one end of the noise suppression tape 10, the electrical connection portion 13b of the conductive layer 13 is electrically connected to the surface of the shielding outer conductor 4b of the shield conductor 4 of the shield cable 1.

At the other end of the noise suppression tape 10, the electrical connection portion 13c of the conductive layer 13 is electrically connected to the housing 51.

As a result, the entire area of the conductive layer 13 of the noise suppression tape 10 serves as the ground potential node, that is, the ground.

Therefore, in the second embodiment also, an effect similar to that of the first embodiment is exhibited, and the electrical connection with the surface of the shielding outer conductor 4b and the electrical connection with the housing 51 are performed by the wide electrical connection portions 13b and 13c, respectively, so that the electrical connection is facilitated.

Third Embodiment

Figure 6:
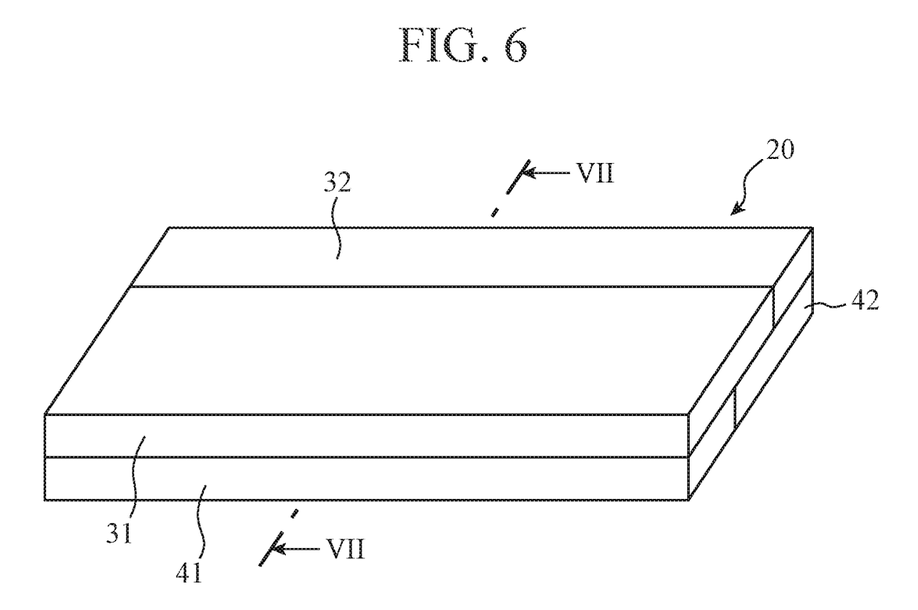
FIG. 6 is a perspective view of a noise suppression tape according to a third embodiment.
Figure 7:
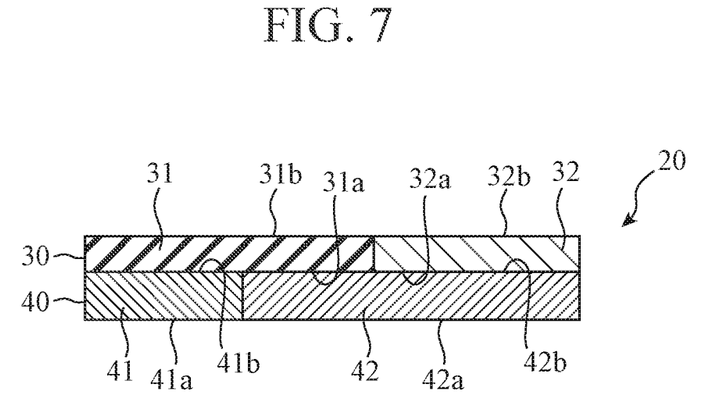
FIG. 7 is a cross-sectional view taken along line VII-VII in FIG. 6.

A noise suppression tape 20 according to a third embodiment is described with reference to FIGS. 6 and 7.

The noise suppression tape 20 is provided with a tape-shaped base 30 and an adhesive layer 40 joined to be fixed to one surface of the base 30 and having the same length and width as those of the base 30.

The base 30 includes an elongated insulator 31 and an elongated conductor 32.

The insulator 31 includes one surface 31a, the other surface 31b, one side face, and another side face. The conductor 32 includes one surface 32a, the other surface 32b, one side face, and another side face, has the same length as the insulator 31, and is disposed in parallel with the insulator 31, in which the one side face is joined to be fixed to the another side face of the insulator 31.

The insulator 31 is a flexible and strip-shaped insulating tape made of synthetic resin.

The conductor 32 is flexible and strip-shaped conductive metal foil such as copper foil or aluminum foil, or a flexible and strip-shaped conductive tape obtained by impregnating a porous non-conductive tape of nonwoven fabric with a conductive adhesive.

The adhesive layer 40 includes a sticky layer 41 and a conductive adhesive layer 42.

The sticky layer 41 includes one surface 41a, the other surface 41b, one side face, and another side face.

The conductive adhesive layer 42 includes one surface 42a, the other surface 42b, one side face, and another side face.

The conductive adhesive layer 42 is disposed in parallel with the sticky layer 41, in which the one side face is joined to the another side face of the sticky layer 41.

The one side face of the sticky layer 41 is flush with the one side face of the insulator 31. The another side face of the conductive adhesive layer 42 is flush with the another side face of the conductor 32.

The sticky layer 41 is an adhesive such as an epoxy resin adhesive, a hot melt adhesive, a rubber solvent type adhesive, an elastic adhesive, or a phenol resin adhesive.

The conductive adhesive layer 42 is a conductive adhesive obtained by mixing conductive metal, carbon fiber, or powder with an adhesive such as an epoxy resin adhesive, a hot melt adhesive, a rubber solvent type adhesive, an elastic adhesive, or a phenol resin adhesive.

Like the noise suppression tape 10 according to the first embodiment, the noise suppression tape 20 according to the third embodiment is applied as in Application Example 1 illustrated in FIG. 3 and Application Example 2 illustrated in FIG. 4.

That is, in Application Example 1, the middle portion of the noise suppression tape 20 is spirally wound around an exposed outer peripheral surface of an inner covering body 3 at a distal end of a shield cable 1 with side portions in the middle portion of the noise suppression tape 20 overlapping each other in such a manner that the other surface of the base 30, that is, the other surface 31b of the insulator 31 and the other surface 32b of the conductor 32 are on an outer side. In addition, one surface of the adhesive layer 40, that is, the one surface 41a of the sticky layer 41 and the one surface 42a of the conductive adhesive layer 42 are adhered to the exposed outer peripheral surface of the inner covering body 3.

At one end of the noise suppression tape 20, one end of the conductive adhesive layer 42 in the adhesive layer 40 is electrically connected to a surface of a shielding outer conductor 4b of a shield conductor 4 of the shield cable 1.

At the other end of the noise suppression tape 20, the other end of the conductive adhesive layer 42 in the adhesive layer 40 is electrically connected to a housing 51.

As a result, the entire area of the conductive adhesive layer 42 the adhesive layer 40 of the noise suppression tape 20 serves as a ground potential node, that is, a ground.

Figure 8:
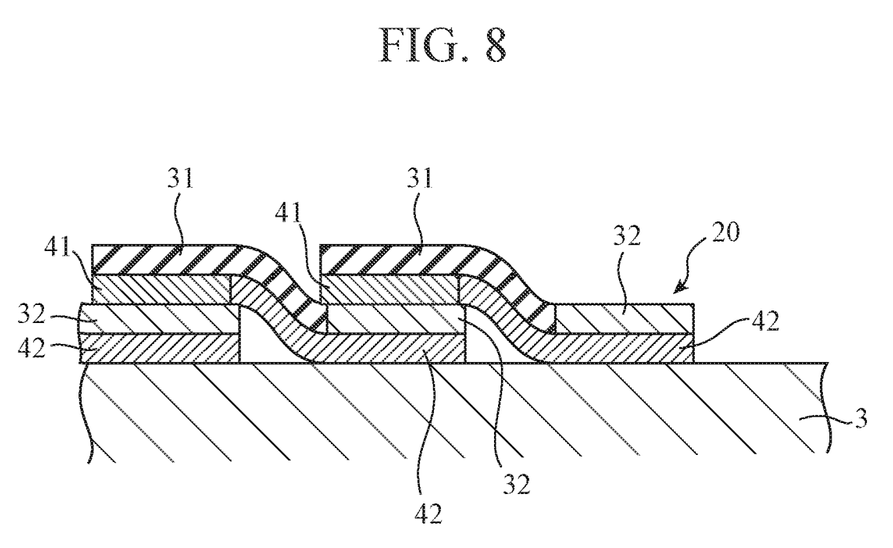
FIG. 8 is a cross-sectional view of a substantial part illustrating an application example in a case where the noise suppression tape according to the third embodiment is used in a shield cable.

When the noise suppression tape 20 is spirally wound around the exposed cuter peripheral surface of the inner covering body 3, as illustrated in FIG. 8, a side portion of the noise suppression tape 20 located on an upper layer and the side portion of the noise suppression tape 20 located on a lower layer overlap each other. Thereby, the conductive adhesive layer 42 of the adhesive layer 40 in the noise suppression tape 20 located on the upper layer and the conductor 32 of the base 30 in the noise suppression tape 20 located on the lower layer are adhered to each other.

As a result, the conductive adhesive layer 42 located on the upper layer and the conductor 32 located on the lower layer serve as the ground, and thereby the entire area of the conductor 32 in the noise suppression tape 20 also serves as the ground.

Therefore, the conductor 32 and the conductive adhesive layer 42 of the noise suppression tape 20 form a shield structure for the inner conductor 2 located inside the exposed inner covering body 3 at the distal end of the shield cable 1, and thereby an effect of blocking noise is exhibited, so that deterioration in shielding performance and noise Immunity can be suppressed.

In the noise suppression tape 20, the one surface 42a of the conductive adhesive layer 42 is exposed, so that the electrical connection between the one end of the conductive adhesive layer 42 and the shielding outer conductor 4b of the shield cable 1, and the electrical connection between the other end of the conductive adhesive layer 42 and the housing 51 of the communication device 50 are facilitated.

Furthermore, when the noise suppression tape 20 is spirally wound around the exposed outer peripheral surface of the inner covering body 3, no capacitance coupling occurs in the overlapping portion between the side portion of the noise suppression tape 20 located on the upper layer and the side portion of the noise suppression tape 20 located on the lower layer. Therefore, as to a high-frequency signal transmitted through the inner conductor 2 of the shield cable 1, deterioration in a signal transmission characteristic at a specific frequency due to an influence of the capacitance coupling does not occur.

In Application Example 2, the middle portion of the noise suppression tape 20 is laid in a longitudinal direction of the shield cable 1 on the exposed outer peripheral surface of the inner covering body 3 at the distal end of the shield cable 1 in such a manner that the other surface of the base 30, that is, the other surface 31b of the insulator 31 and the other surface 32b of the conductor 32 are on the outer side. In addition, the one surface of the adhesive layer 40, that is, the one surface 41a of the sticky layer 41 and the one surface 42a of the conductive adhesive layer 42 are adhered to the exposed outer peripheral surface of the inner covering body 3.

At the one end of the noise suppression tape 20, the one end of the conductive adhesive layer 42 in the adhesive layer 40 is electrically connected to the surface of the shielding outer conductor 4b of the shield conductor 4 of the shield cable 1.

At the other end of the noise suppression tape 20, the other end of the conductive adhesive layer 42 in the adhesive layer 40 is electrically connected to the housing 51.

As a result, the entire area of the conductive adhesive layer 42 in the adhesive layer 40 of the noise suppression tape 20 serves as the ground potential node, that is, the ground.

Since the conductor 32 of the base 30 and the conductive adhesive layer 42 of the adhesive layer 40 are partially joined to be fixed, the entire area of the conductor 32 in the noise suppression tape 20 serves as the ground potential node, that is, the ground as is the case with the conductive adhesive layer 42.

In Application Example 2 configured as described above also, as in Application Example 1, the effect of shielding the inner conductor 2 of the shield cable 1 from noise is exhibited in the portion where the inner covering body 3 of the shield cable 1 is exposed. In addition, the electrical connection between the one end of the conductive adhesive layer 42 and the shielding outer conductor 4b of the shield cable 1, and the electrical connection between the other end of the conductive adhesive layer 42 and the housing 51 of the communication device 50 are facilitated.

Note that, the embodiments can be freely combined, any component of each embodiment can be modified, or any component can be omitted in each embodiment.

INDUSTRIAL APPLICABILITY

The noise suppression tape according to the present disclosure is suitably applied to a shield cable that is connected to a communication device and transmits a high-frequency signal.

REFERENCE SIGNS LIST

1: shield cable, 2: inner conductor, 3: inner covering body, 4: shield conductor, 4a: resin layer, 4b: shielding outer conductor, 4c: pig tail, 5: outer covering body, 10: noise suppression tape, 11: insulator, 12: sticky layer, 13: conductive layer, 20: noise suppression tape, 30: base, 31: insulator, 32: conductor, 40: adhesive layer, 41: sticky layer, 42: conductive adhesive layer

The invention claimed is:

1. A noise suppression tape to be adhered to an exposed outer peripheral surface of an inner covering body in a shield cable including an inner conductor through which a signal is to be transmitted, the inner covering body which covers an entire outer peripheral surface of the inner conductor, a shield conductor which covers an entire outer peripheral surface of the inner covering body, and an outer covering body which covers an entire outer peripheral surface of the shield conductor, the inner conductor being protruded from the inner covering body at a distal end of the shield cable, the outer peripheral surface of the inner covering body being exposed at the distal end, the outer peripheral surface of the shield conductor being exposed at the distal end, the noise suppression tape comprising:

a tape-shaped base including an elongated insulator including a first surface, a second surface, a first side face, and a second side face, and a conductor including a first surface, a second surface, a first side face, and a second side face, the conductor having a same length as the insulator, the conductor being disposed in parallel with the insulator, the first side face of the conductor being joined to be fixed to the second side face of the insulator; and an adhesive layer having a same length as the base, the adhesive layer including a sticky layer including a first surface, a second surface, a first side face, and a second side face, and a conductive adhesive layer including a first surface, a second surface, a first side face, and a second side face, the conductive adhesive layer being disposed in parallel with the sticky layer, the first side face of the conductive adhesive layer being joined to the second side face of the sticky layer, the first side face of the sticky layer being flush with the first side face of the insulator, the second side face of the conductive adhesive layer being flush with the second side face of the conductor, a first surface of the adhesive layer being joined to be fixed to a first surface of the base, a second surface of the adhesive layer in a middle portion of the adhesive layer being to be adhered to the outer peripheral surface of the inner covering body of the shield cable, a first end of the conductive adhesive layer being to be electrically connected to the shield conductor of the shield cable, a second end of the conductive adhesive layer being to be electrically connected to a ground potential node.

2. The noise suppression tape according to claim 1, wherein a middle portion of the base and the middle portion of the adhesive layer are to be spirally wound around the outer peripheral surface of the inner covering body of the shield cable with side portions in the middle portion of the base and the middle portion of the adhesive layer overlapping each other.

3. The noise suppression tape according to claim 1, wherein a middle portion of the base and the middle portion of the adhesive layer are to be adhered to the outer peripheral surface of the inner covering body of the shield cable in a longitudinal direction.

\* \* \* \* \*